United States Patent [19]
Nakahira et al.

[11] Patent Number: 5,973,988
[45] Date of Patent: Oct. 26, 1999

[54] SEMICONDUCTOR MEMORY DEVICE HAVING CIRCUIT FOR MONITORING SET VALUE OF MODE REGISTER

[75] Inventors: Miki Nakahira; Takashi Itou, both of Hyogo, Japan

[73] Assignee: Mitsubishi Denki Kabushiki Kaisha, Tokyo, Japan

[21] Appl. No.: 09/225,452

[22] Filed: Jan. 6, 1999

[30] Foreign Application Priority Data

Jul. 15, 1998 [JP] Japan .................................. 10-200424

[51] Int. Cl.$^6$ ..................................................... G11C 8/00
[52] U.S. Cl. ................................ 365/230.08; 365/189.03; 365/189.05; 365/189.08; 365/189.07; 365/230.06; 365/233
[58] Field of Search ......................... 365/230.08, 189.03, 365/189.05, 189.08, 230.06, 189.07, 233

[56] References Cited

U.S. PATENT DOCUMENTS

| | | | |
|---|---|---|---|
| 5,392,239 | 2/1995 | Margulis et al. | 365/189.01 |
| 5,438,548 | 8/1995 | Houston | 365/227 |
| 5,625,302 | 4/1997 | Covino et al. | 326/93 |

*Primary Examiner*—Andrew Q. Tran
*Attorney, Agent, or Firm*—McDermott, Will & Emery

[57] ABSTRACT

A central control circuit in a semiconductor memory device includes a command decoder and an MRS output circuit. The command decoder decodes an internal control signal. The MRS output circuit generates a control signal for writing a set value of a mode register into a memory cell. According to the control signal, the set value of the mode register is transferred to a data input/output line. A data input/output buffer receives data from the data input/output line, and the data is written into a specific memory cell. The written data is output at a data input/output pin by a normal read operation. A semiconductor memory device allowing externally monitoring a set value of a mode register is thus provided.

16 Claims, 12 Drawing Sheets

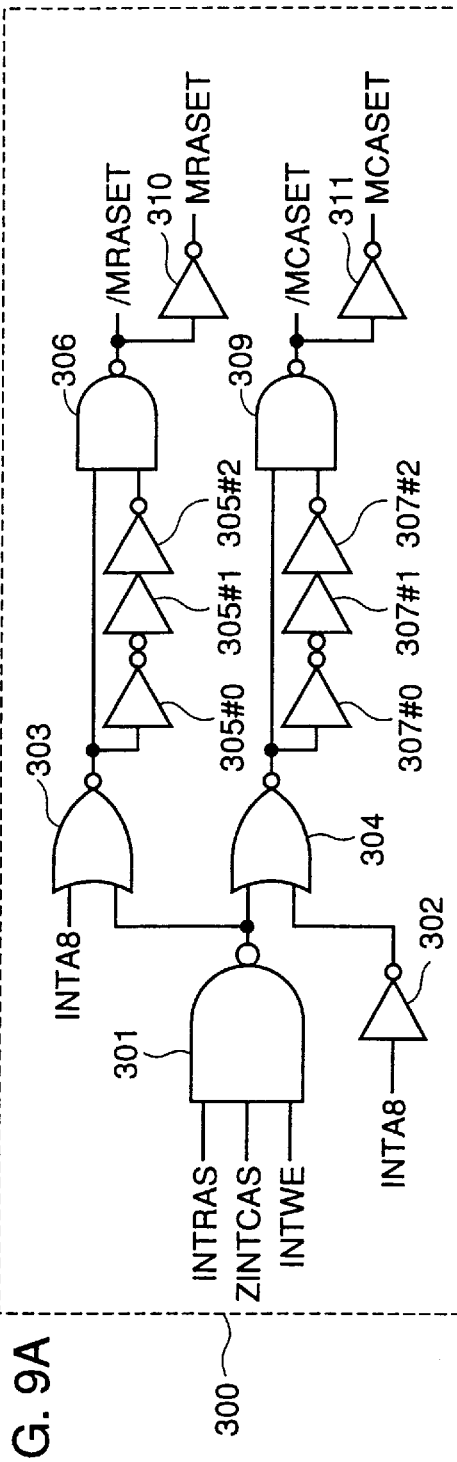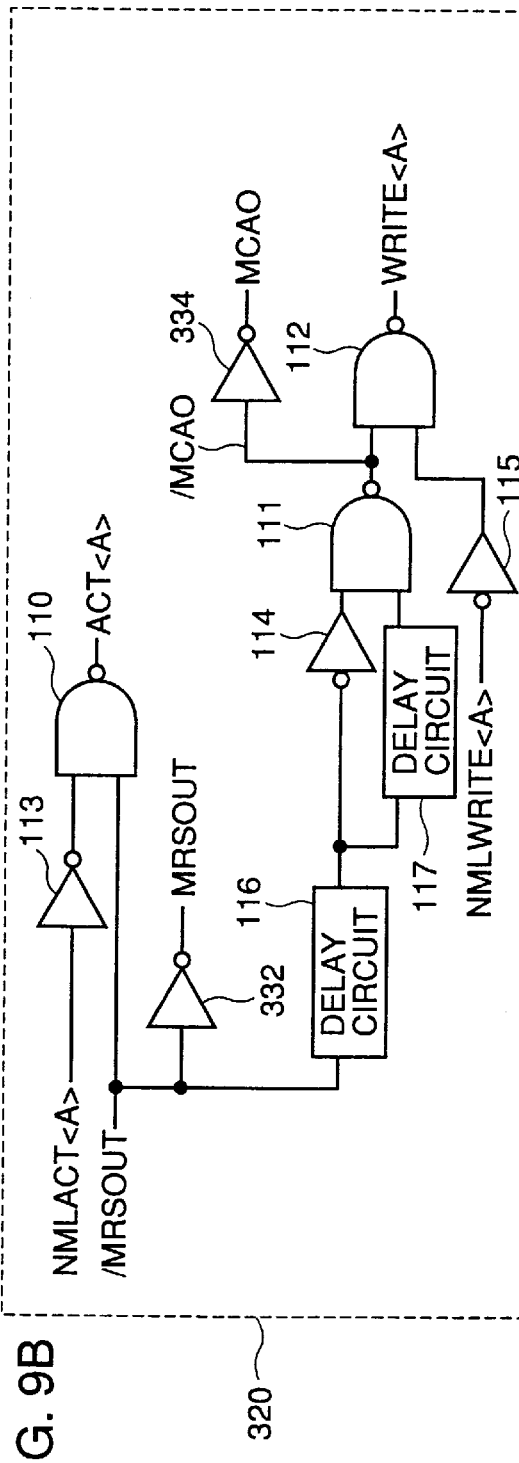
FIG. 9A
FIG. 9B

SEMICONDUCTOR MEMORY DEVICE HAVING CIRCUIT FOR MONITORING SET VALUE OF MODE REGISTER

BACKGROUND OF THE INVENTION

1. Field of the Invention

The present invention relates to a semiconductor memory device, and more particularly to a semiconductor memory device provided with a mode register.

2. Description of the Background Art

A synchronous DRAM (a synchronous semiconductor memory device) is provided with a mode register. An operation mode for the synchronous DRAM can be designated by setting the mode register.

In a conventional semiconductor memory device, such a mode register has been used to determine its operation mode.

In such a semiconductor memory device, however, once the operation mode has been set, it is impossible to confirm the set value in the mode register, or, to check whether a desired value has been set to the mode register or not. Therefore, in practical use, a test must be conducted to check whether the semiconductor memory device operates as desired in order to determine whether or not a desired value has been set. Such a test is laborsome and time consuming.

SUMMARY OF THE INVENTION

Accordingly, an object of the present invention is to provide a semiconductor memory device allowing confirmation of a set state of a mode register externally with ease.

A semiconductor memory device according to the present invention includes a memory cell array having a plurality of memory cells arranged in rows and columns; a mode register for setting a value designating a specific operation mode in response to a mode register set signal externally supplied; a control circuit for outputting a control signal for externally monitoring the set value of the mode register in response to a specific operation signal externally supplied; a write circuit responsive to a write instruction for writing the set value of the mode register into a specific memory cell of the plurality of memory cells based on the control signal; and, a read circuit responsive to a read instruction for reading data out of the memory cell array.

Accordingly, the semiconductor memory device according to the present invention is advantageous in that a set value of a mode register can be written into a specific memory cell, and the set value thus written can be externally output with a normal read operation, thereby allowing external confirmation of the set value of the mode register.

Specifically, a transfer circuit is provided to transfer the set value of the mode register onto a data input/output line, and therefore, writing the set value into a memory cell becomes possible.

The set value of the mode register can be written into a memory cell corresponding to a fixed address.

A specific memory cell for writing the set value of the mode register therein can be designated arbitrarily based on an external address signal. This increases flexibility in writing.

Specifically, a circuit for decoding the set value of the mode register and a transfer circuit for transferring an output of the decode circuit onto a data input/output line are further provided. Accordingly, the decoded set value can be written into a memory cell. As a result, the set value of the mode register can be confirmed using pins smaller in number than signals forming the set value.

The decoded set value of the mode register can be written into a memory cell corresponding to a fixed address.

A specific memory cell for writing the decoded set value of the mode register therein can be designated freely based on an external address signal, which leads to increased flexibility in writing.

Specifically, there are further provided a comparison and determination circuit for comparing the set value of the mode register and the external address signal representing an originally intended value to determine their match/mismatch, and a transfer circuit for transferring an output of the comparison and determination circuit onto a data input/output line. Accordingly, information on the match/mismatch between the actual set value and the intended, or, target value can be written into a memory cell. It is also possible to externally confirm this result of comparison and determination in a normal read operation.

The result of the comparison and determination can be written into a memory cell corresponding to a fixed address.

A specific memory cell for writing the result of the comparison and determination therein can be designated as desired based on an external address signal, whereby flexibility in writing increases.

Specifically, there are further provided a plurality of comparison and determination circuits each corresponding to a respective mode to be set at the mode register for comparing the set value and the external address signal to determine match/mismatch therebetween, and a transfer circuit for transferring respective outputs of the comparison and determination circuits onto a data input/output line. Accordingly, information on the match/mismatch between the actual set value and the target value for each mode can be written into a memory cell. It is also possible to externally confirm the result of the comparison and determination in a normal read operation.

The result of the comparison and determination for each mode can be written into a memory cell corresponding to a fixed address.

A specific memory cell for writing the result of the comparison and determination for each mode therein can be designated freely based on an external address signal. Flexibility in writing thus increases.

Specifically, there are provided a comparison and determination circuit for comparing the set value and the external address signal for each mode to be set at the mode register and collecting the comparison results to determine whether or not they perfectly match, and a transfer circuit for transferring the output of the comparison and determination circuit onto a data input/output line. Accordingly, a single signal representing the result of the comparison and determination, specifically showing perfect match/mismatch between the actual set values and the target values, can be written into a memory cell. This result of the comparison and the determination can be externally confirmed in a normal read operation. The set value of the mode register thus can be externally confirmed using a still smaller number of pins.

The result of the comparison and determination can be written into a memory cell corresponding to a fixed address.

A specific memory cell for writing therein the result of the comparison and determination can be designated arbitrarily based on an external address signal, thereby ensuring a higher degree of flexibility in writing.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 9A and 9B are schematic block diagrams respectively showing exemplary configurations of an addressing command decoder 300 and an MRS output circuit 320 in a semiconductor memory device according to a third embodiment of the present invention.

DESCRIPTION OF THE PREFERRED EMBODIMENTS

First Embodiment

A semiconductor memory device according to the first embodiment of the present invention will now be described. The semiconductor memory device according to the first embodiment enables external confirmation of a set value of a mode register.

A configuration of the main portion of a semiconductor memory device 1000 according to the first embodiment will be described with reference to FIG. 1.

Figure 1:
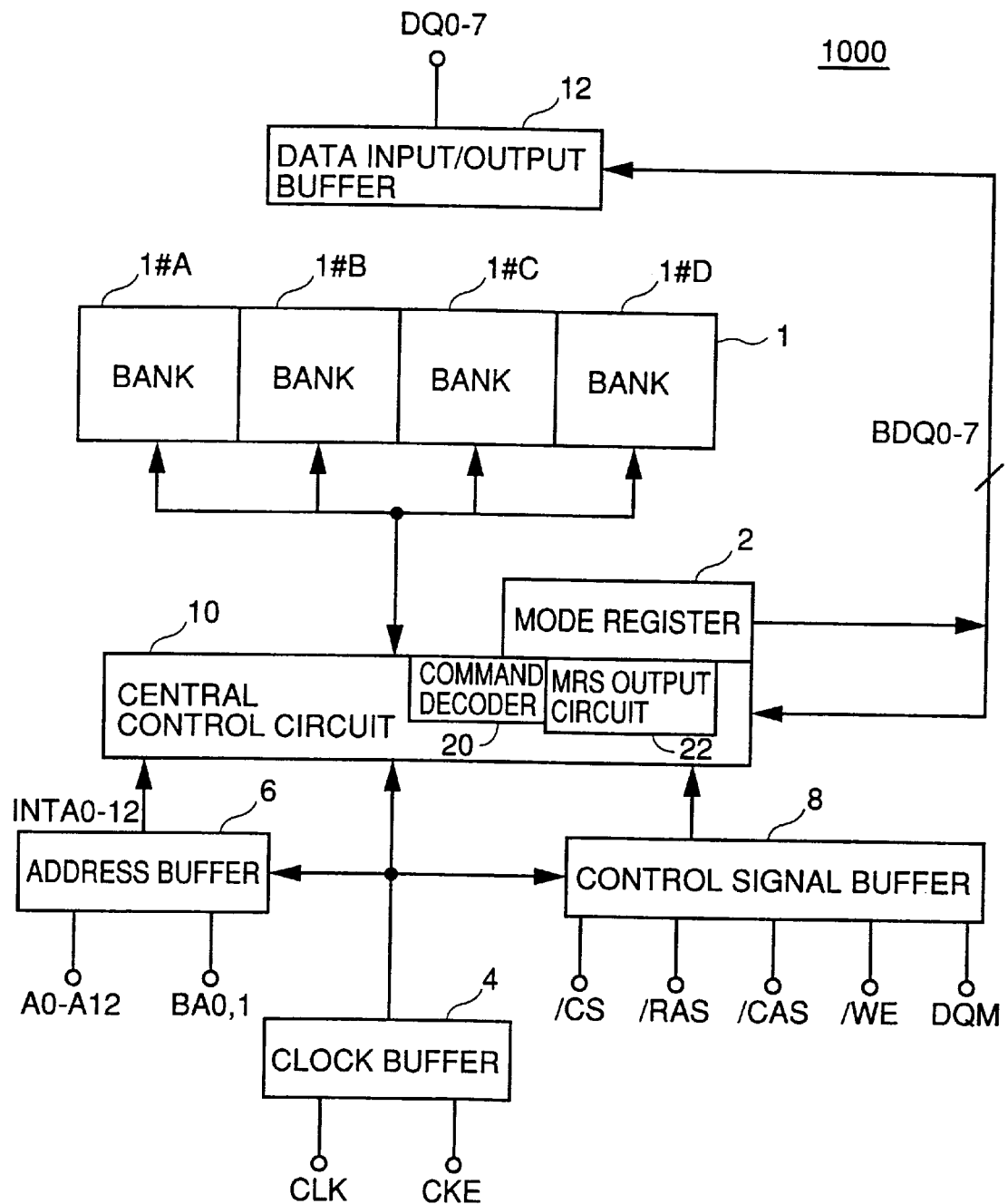
FIG. 1 is a schematic block diagram showing an exemplary configuration of the main portion of a semiconductor memory device 1000 according to a first embodiment of the present invention.

Semiconductor memory device 1000 in FIG. 1 is shown by way of example as a synchronous DRAM of 64 Mbit×8. Semiconductor memory device 1000 includes a mode register 2, a clock buffer 4, an address buffer 6, a control signal buffer 8, a central control circuit 10, a data input/output buffer 12, and a plurality of banks 1#A, 1#B, 1#C and 1#D.

Address buffer 6 receives external address signals A0–A12 and bank address signals BA0 and BA1. Address buffer 6 latches external address signals A0–A12 as internal address signals INTA0–INTA12.

Clock buffer 4 receives an external clock signal CLK and a clock enable signal CKE. Clock buffer 4 outputs an internal clock signal for controlling the operation of an internal circuit.

Control signal buffer 8 receives external control signals (an external chip select signal /CS, an external row address strobe signal /RAS, an external column address strobe signal /CAS, an external write enable signal /WE, an input/output mask signal DQM, and so on).

A memory cell array 1 is formed of four banks in total, i.e., banks 1#A, 1#B, 1#C and 1#D. These banks are operable independent of one another. Data input/output buffer 12 sends and receives data between these banks and data input/output pins DQ0–DQ7. As will be described later, data input/output buffer 12 receives a set value of mode register 2 via data input/output lines BDQ0–7.

Mode register 2 is a register allowing external setting of operation modes including a CAS latency. Mode register 2 has its set value changed in response to an externally supplied signal, which set value designates the CAS latency and the like.

Central control circuit 10 controls the operation of the entire chip. Central control circuit 10 includes a command decoder 20 and an MRS output circuit 22. Command decoder 20 is a circuit for decoding each internal control signal latched at control signal buffer 8 into a command.

MRS output circuit 22 controls writing of the set value of mode register 2 into a memory cell. MRS output circuit 22 starts its operation in response to a command received from command decoder 20.

Figure 2:
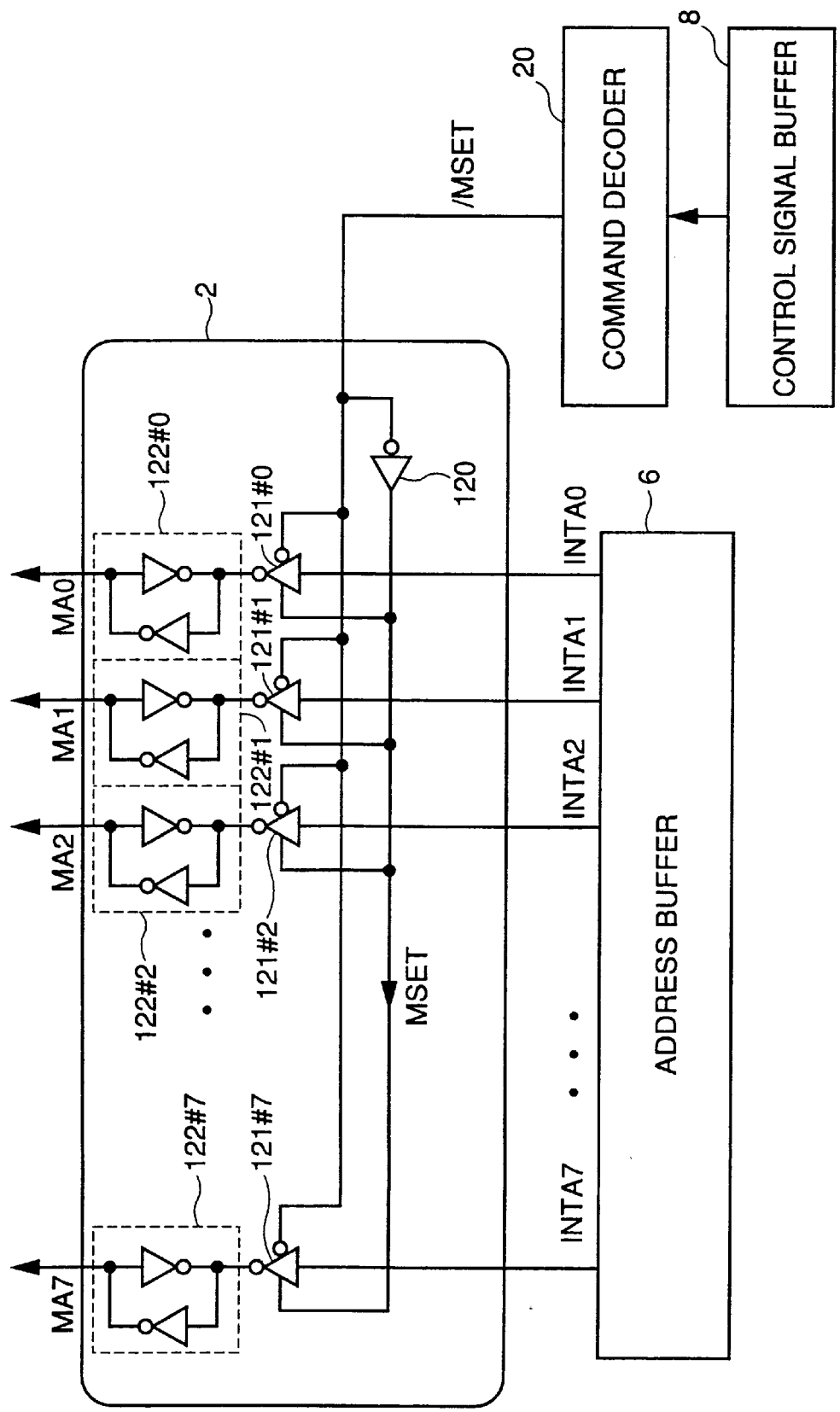
FIG. 2 is a diagram showing a circuit configuration of a mode register 2 shown in FIG. 1.

Mode register 2 will now be described with reference to FIG. 2. A peripheral circuit is also shown in FIG. 2 for reference.

Mode register 2 sets, in response to a mode register set signal /MSET, signals MA0–MA7 based on internal address signals INTA0–INTA7 received from address buffer 6.

Mode register 2 includes an inverter circuit 120, clocked inverter circuits 121#0–121#7, and latch circuits 122#0–122#7.

As will be described later, command decoder 20 outputs mode register set signal /MSET based on an output of control signal buffer 8. Inverter circuit 120 inverts mode register set signal /MSET and outputs a signal MSET.

Clocked inverter circuits 121#0–121#7 and latch circuits 122#0–122#7 are disposed corresponding to internal address signals INTA0–INTA7, respectively. Clocked inverter circuits 121#0–121#7 are respectively rendered conductive according to mode register set signal /MSET at a low (L) level and signal MSET at a high (H) level, thereby inverting corresponding internal address signals INTA0–INTA7 and outputting the inverted signals, respectively.

Latch circuits 122#0–122#7 latch respective outputs of the corresponding clocked inverter circuits 121#0–121#7. Latch circuits 122#0–122#7 output signals MA0–MA7, respectively, which determine specific operation modes.

Figure 3:
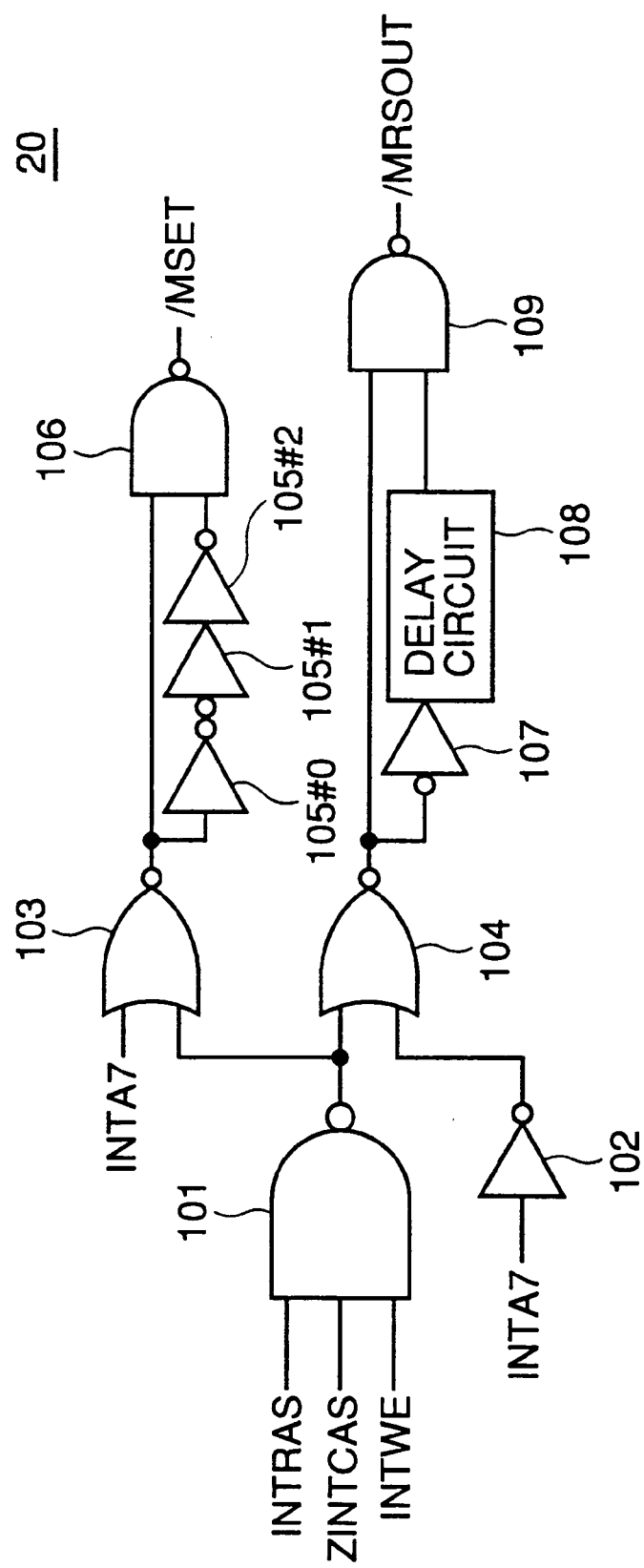
FIG. 3 is a diagram showing a circuit configuration of a command decoder 20 shown in FIG. 1.

Command decoder 20 will now be described with reference to FIG. 3. Command decoder 20 includes NAND circuits 101, 106 and 109, NOR circuits 103 and 104, inverter circuits 102, 107, 105#0, 105#1, and 105#2, and a delay circuit 108.

NAND circuit 101 receives an internal row address strobe signal INTRAS, an internal column address strobe signal ZINTCAS, and an internal write enable signal INTWE at the respective inputs.

Internal row address strobe signal INTRAS is in opposite phase with external row address strobe signal /RAS. Internal write enable signal INTWE and external write enable signal /WE have opposite phases. Internal column address strobe signal INTCAS is in phase with external column address strobe signal /CAS.

NOR circuit 103 receives an output of NAND circuit 101 and internal address signal INTA7 at its inputs. Inverter circuit 102 inverts internal address signal INTA7. NOR circuit 104 receives, at its inputs, the output of NAND circuit 101 and an output of inverter circuit 102.

Inverter circuits 105#0, 105#1and 105#2are serially connected between an output node of NOR circuit 103 and an input node of NAND circuit 106. NAND circuit 106 receives an output of NOR circuit 103 and an output of inverter circuit 105#2, and outputs one shot mode register set signal /MSET.

Inverter circuit 107 inverts an output of NOR circuit 104. Delay circuit 108 delays an output of inverter circuit 107 by a prescribed time period (referred to as "DELAY1"). NAND circuit 109 receives the output of NOR circuit 104 and an output of delay circuit 108, and outputs a control signal /MRSOUT.

Mode register set signal /MSET and control signal /MRSOUT are both low active signals. Control signal /MRSOUT is a signal for writing a set value of mode register 2 into a memory cell.

Figure 4:
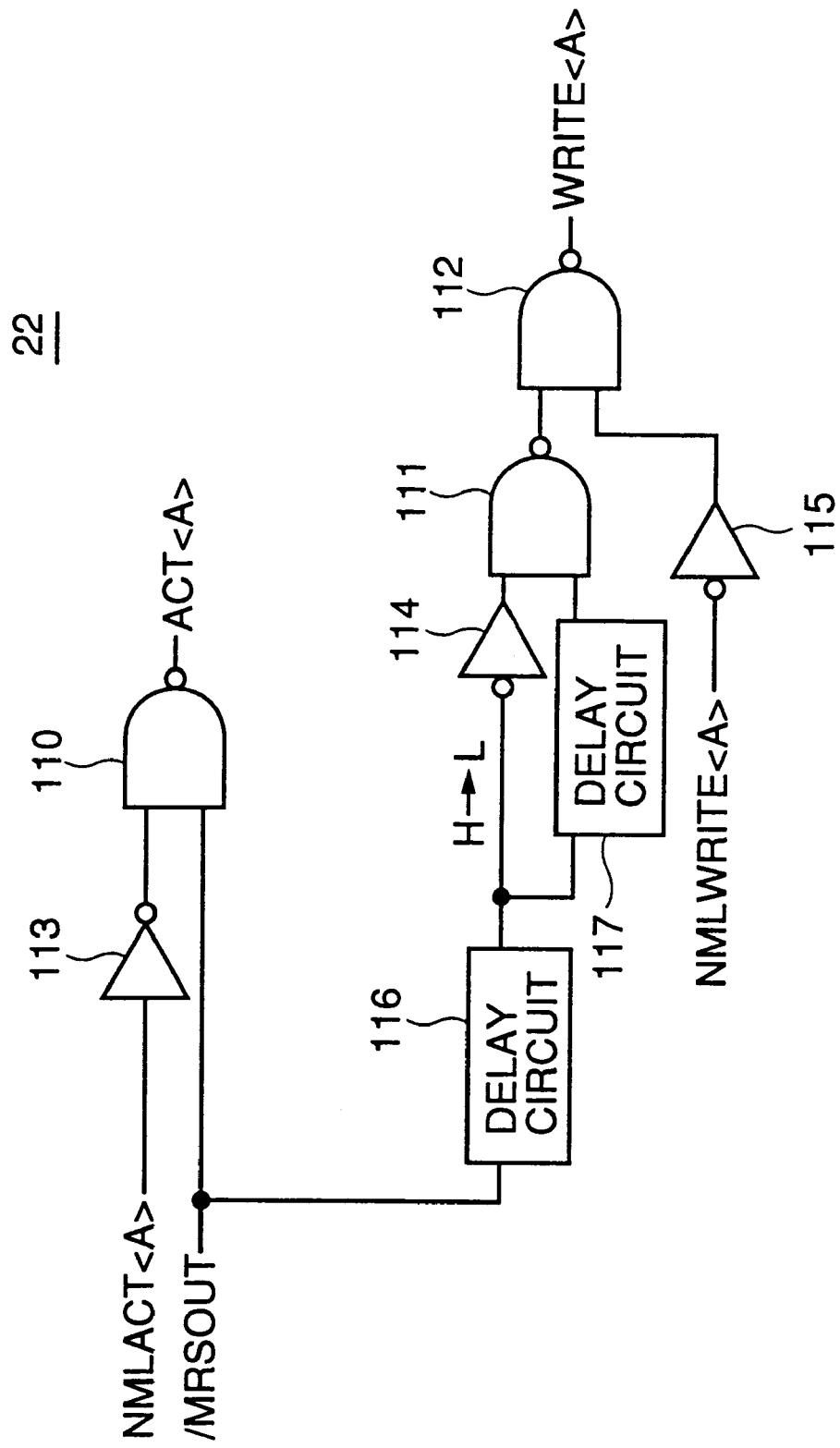
FIG. 4 is a diagram showing an exemplary circuit configuration of an MRS output circuit 22 shown in FIG. 1.

MRS output circuit 22 will now be described with reference to FIG. 4. MRS output circuit 22 includes NAND circuits 110, 111 and 112, inverter circuits 113, 114 and 115, and delay circuits 116 and 117.

Inverter circuit 113 receives and inverts a row activation signal NMLACT (A), which is a signal for activating row related circuitry at bank 1#A in a normal mode.

NAND circuit 110 receives an output of inverter circuit 113 and control signal /MRSOUT at its inputs, and outputs an act signal ACT (A), which activates bank 1#A.

Delay circuit 116 delays control signal /MRSOUT by a prescribed time period (referred to as "DELAY2"). Inverter circuit 114 inverts an output of delay circuit 116. Delay circuit 117 delays the output of delay circuit 116 by a prescribed time period (DELAY3). NAND circuit 111 receives, at the respective inputs, an output of inverter circuit 114 and an output of delay circuit 117.

Inverter circuit 115 receives and inverts a signal NMLWRITE (A), which is a write designating signal for bank 1#A in a normal mode.

NAND circuit 112 receives an output of NAND circuit 111 and an output of inverter circuit 115, and outputs a write designating signal WRITE (A) for bank 1#A.

Figure 5:
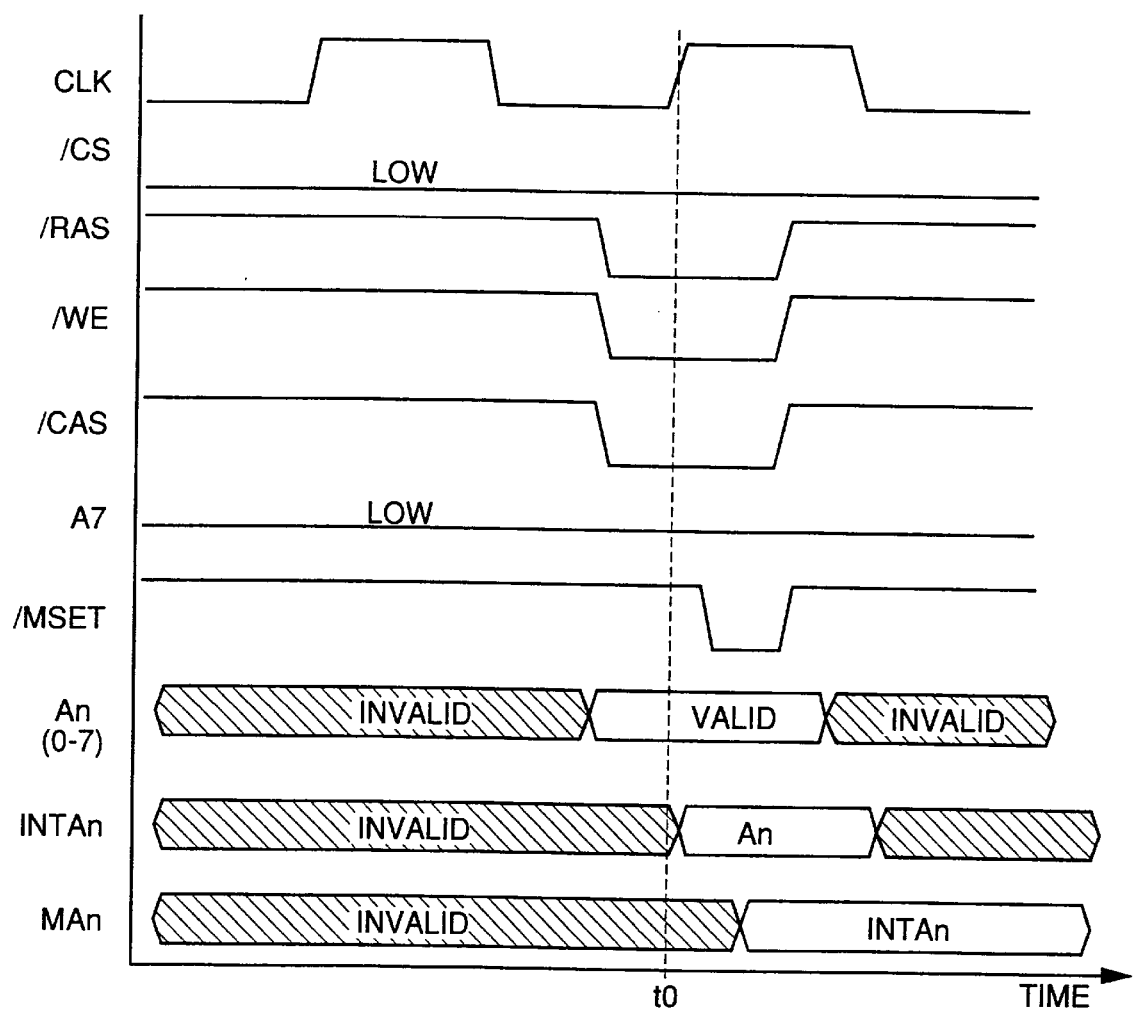
FIG. 5 is a timing chart illustrating a method of setting the mode register 2.

A method of setting mode register 2 will now be described with reference to FIGS. 1–4 and a timing chart in FIG. 5. In FIG. 5, a denotation An (n=0–7) represents external address signals, INTAn (n=0–7) represents internal address signals, and MAn (n=0–7) represents signals MA0–MA7 at mode resister 2.

With reference to FIGS. 1–5, if control signal buffer 8 receives external chip select signal /CS, external row address strobe signal /RAS, external write enable signal /WE, and external column address strobe signal /CAS all at an L level at a rise of external clock signal CLK, address buffer 6 latches external address signals A0–A7 as internal address signals INTA0–INTA7 (time t0 in FIG. 5).

Control signal buffer 8 latches external row address strobe signal /RAS, external write enable signal /WE, and external column address strobe signal /CAS as internal row address strobe signal INTRAS, internal write enable signal INTWE, and internal column address strobe signal INTCAS, respectively.

If external address signal A7 is at an L level at this time, command decoder 20 recognizes that a mode register set command (MRS) has been input. In response to this, one shot mode register set signal /MSET (fall fiom an H level to an L level and rise from the L level to an H level) is generated.

Clocked inverter circuits 121#0–121#7at mode register 2 are rendered conductive, which leads to latching of internal address signals INTA0–INTA7. As a result, a certain value corresponding to a specific mode is set at mode register 2 (signals MA0, MA1, . . . ).

An address corresponding to signals MA0–MA2 shows a burst length, for example. Here, a burst length is a value representing the number of times data input/output is conducted in response to one write or read instruction. For example, burst length 2 means that two pieces of data are input or output according to one instruction.

Next, a configuration for writing the set value of the mode register 2 into a memory cell will be described with reference to FIG. 6.

Figure 6:
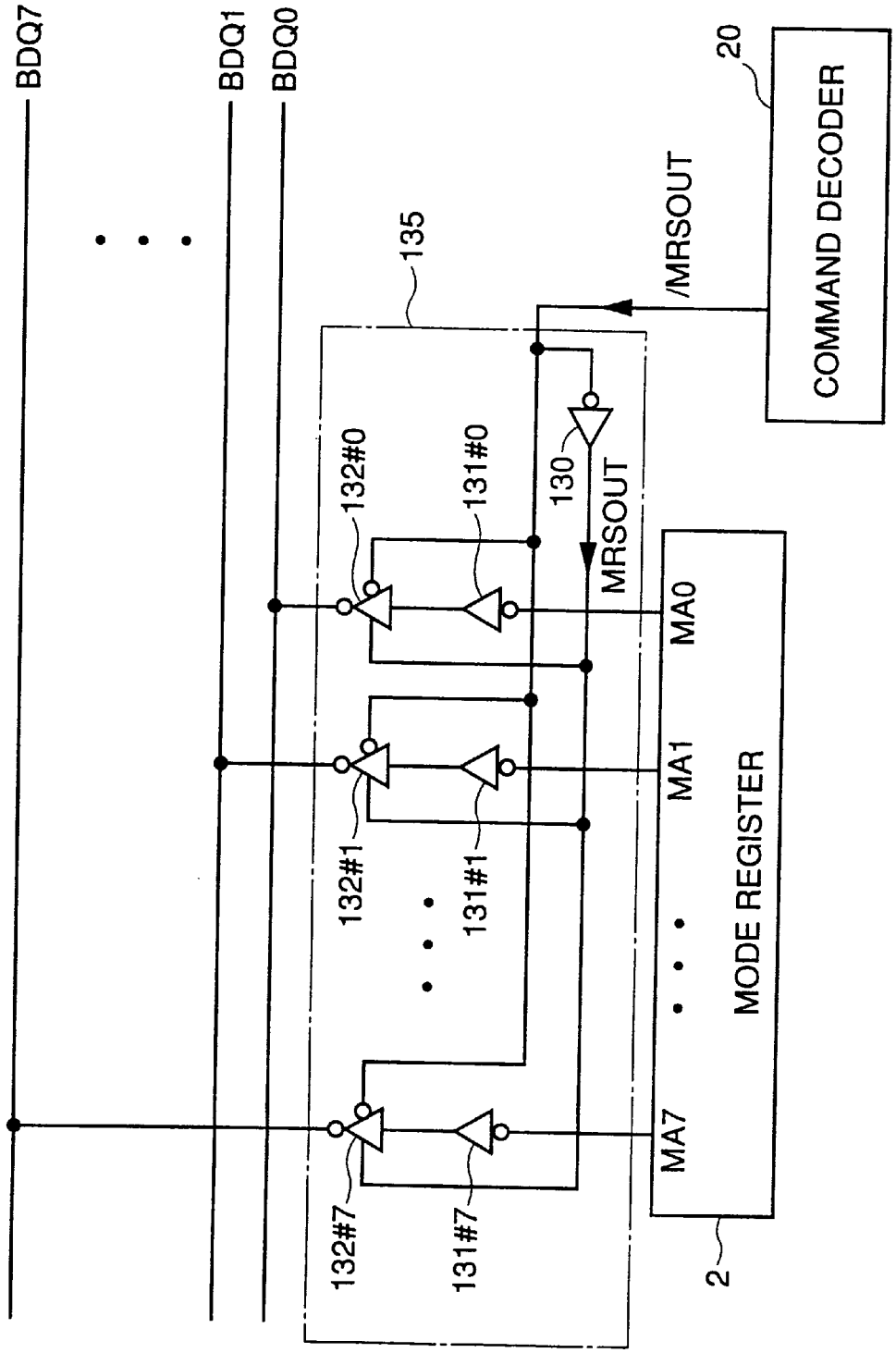
FIG. 6 is a diagram of a circuit for writing a set value of the mode register 2 into a memory cell.

Referring to FIG. 6, provided between mode register 2 and data input/output lines BDQ0–BDQ7 is a data transfer circuit 135 corresponding to the mode register. Data transfer circuit 135 includes inverter circuits 130 and 131#0–131#7, and clocked inverter circuits 132#0–132#7.

Inverter circuits 131#0–131#7invert output signals MA0–MA7 of mode register 2, respectively. Inverter circuit 130 inverts control signal /MRSOUT output from command decoder 20, and outputs control signal MRSOUT.

Clocked inverter circuits 132#0–132#7invert respective outputs of inverter circuits 131#0–131#7in response to control signals /MRSOUT and MRSOUT, and output the inverted signals onto data input/output lines BDQ0–BDQ7, respectively.

Figure 7:
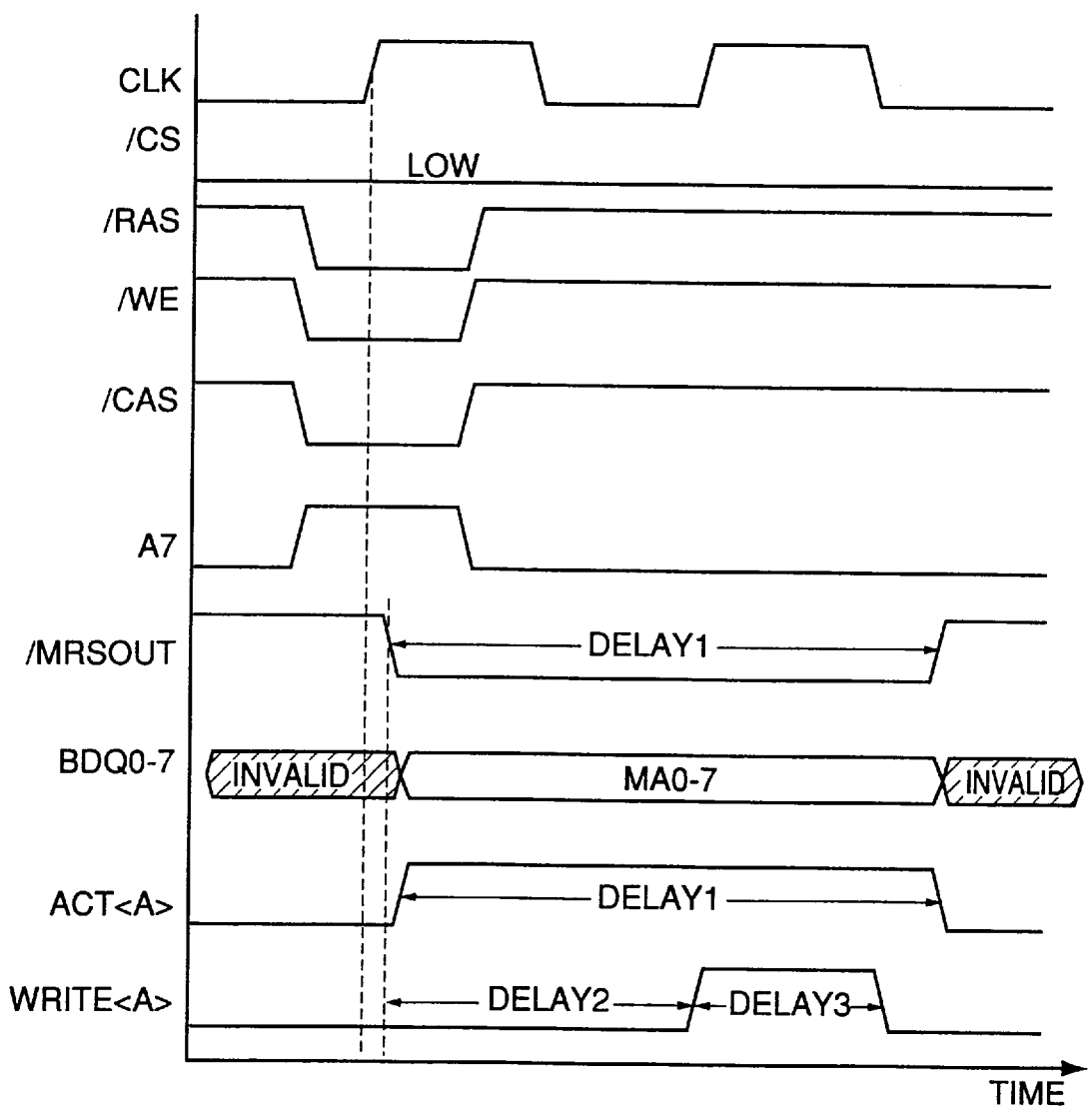
FIG. 7 is a timing chart illustrating a method for writing the set value of the mode register 2 into the memory cell.

A method of writing the set value of mode register 2 into a memory cell will be described with reference to FIGS. 1–6 and a timing chart in FIG. 7.

Referring to FIGS. 1 to 7, it is assumed, by way of example, that a mode resister write command to write the contents of mode register 2 into a memory cell is generated when a mode register set command is input (i.e., signal /MSET is activated) at the time external address signal A7 is at an H level. (Note that a combination of signals to form the mode register write command is not limited to the above example.)

A rise of external clock signal CLK to an H level at the time when external address signal A7 is at the H level and external row address strobe signal /RAS, external column address strobe signal /CAS and external write enable signal /WE are all at an L level causes command decoder 20 to output control signal /MRSOUT at an L level. Control signal /MRSOUT is held at the L level during time period DELAY1, which period is determined by delay circuit 108.

Data transfer circuit 135 receives control signal /MRSOUT, and transfers signals MA0–MA7 latched at respective latch circuits in mode register 2 onto corresponding data input/output lines BDQ0–BDQ7, respectively. Data on data input/output lines BDQ0–BDQ7 are transferred to data input/output buffer 12.

Row activation signal ACT (A) for bank 1#A attains an H level during the time period when control signal /MRSOUT is at an L level, whereby a corresponding word line is selected. Note that a bank to be activated is not limited to bank 1#A.

If row activation signal NMLACT (A) is generated in a normal operation, an internal address signal (INTA0–INTA12) is transmitted as a row address. If control signal /MRSOUT is generated, transfer of INTA0–INTA12 is stopped, for example. In this case, the row address bits are all at an L level, and a word line corresponding to a row address 0 thus attains a selected state.

Write designating signal WRITE (A) rises a time period DELAY2 after a timing of fall of control signal /MRSOUT. The time period DELAY2 is determined by delay circuit 116. Write designating signal WRITE (A) is held at the H level during a time period DELAY3, which is determined by delay circuit 117.

The rise of write designating signal WRITE (A) to an H level enables a write circuit (not shown) that operates when writing in a normal operation mode to write into a memory cell the data latched in data input/output buffer 12 (i.e., the set value of mode register 2).

In column related circuitry, as in the row related circuitry, the internal address signal (INTA0–INTA8) is transmitted as a column address normally when write designating signal NMLWRITE (A) is at an H level. When control signal /MRSOUT is generated, transfer of INTA0–INTA8 is stopped, for example. In this case, the column address bits are all at an L level, whereby a bit line corresponding to a column address 0 attains a selected state.

Thereafter, row activation signal ACT (A) falls to an L level when control signal /MRSOUT returns to an H level, so that the word line is inactivated. Writing is thus completed.

By using a normal read command to read data in the memory cell at row address 0 and column address 0 after such operations, the contents of mode register 2 can be output at data input/output pins DQ0–DQ7. Accordingly, it becomes possible to monitor the contents of mode register 2.

Second Embodiment

A semiconductor memory device according to the second embodiment of the present invention will now be described. In contrast with the first embodiment in which a configuration for confirming a set value itself of mode register 2 has been described, the second embodiment shows a configuration which allows configuration of a decoded signal of the set value of mode register 2.

A configuration of the main portion of a semiconductor memory device according to the second embodiment will be described with reference to FIG. 8, in which same components as in the semiconductor memory device 1000 of the first embodiment are denoted by same characters and symbols, and description thereof is not repeated.

Figure 8:
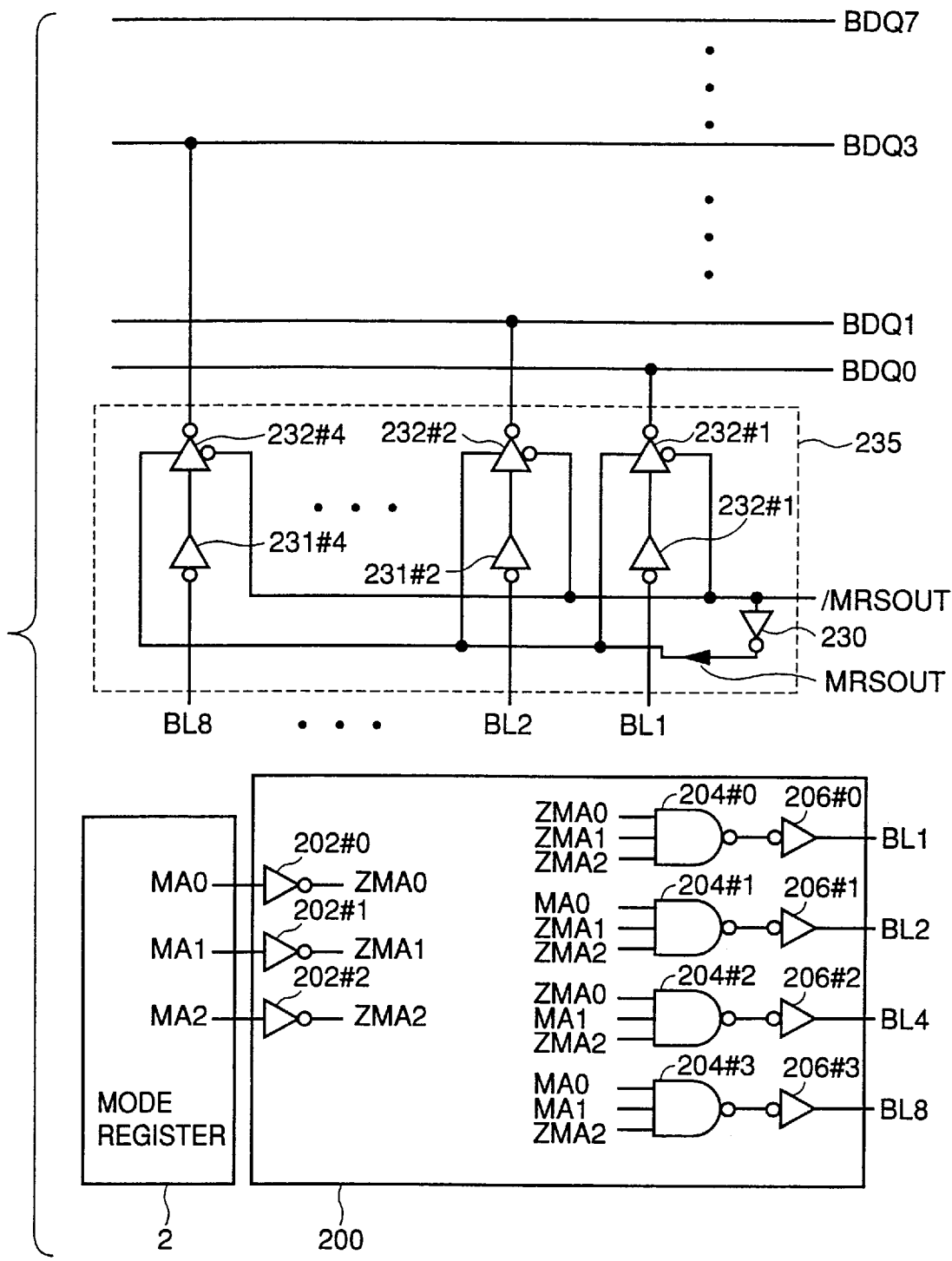
FIG. 8 is a schematic block diagram showing an exemplary configuration of the main portion of a semiconductor memory device according to a second embodiment of the present invention.

The semiconductor memory device shown in FIG. 8 differs from semiconductor memory device 1000 of the first embodiment in that the former is provided with a decoder 200 between mode register 2 and data input/output lines BDQ0–BDQ7.

Decoder 200 in FIG. 8 includes inverter circuits 202#0, 202#1, and 202#2. Respective inverter circuits 202#0, 202#1 and 202#2 invert signals MA0, MA1 and MA2 of mode register 2, and output signals ZMA0, ZMA1 and ZMA2, respectively.

Decoder 200 further includes NAND circuits 204#0, 204#1, 204#2 and 204#3, and inverter circuits 206#0, 206#1, 206#2 and 206#3.

NAND circuit 204#0 receives signals ZMA0, ZMA1 and ZMA2 at the respective inputs. NAND circuit 204#1 receives signals MA0, ZMA1 and ZMA2. NAND circuit 204#2 receives signals ZMA0, MA1 and ZMA2. NAND circuit 204#3 receives signals MA0, MA1 and ZMA2.

Inverter circuit 206#0 inverts an output of NAND circuit 204#0 and outputs a signal BL1. Inverter circuit 206#1 inverts an output of NAND circuit 204#1 and outputs a signal BL2. Inverter circuit 206#2 inverts an output of NAND circuit 204#2 and outputs a signal BL4. Inverter circuit 206#3 inverts an output of NAND circuit 204#3 and outputs a signal BL8.

Assume that signals MA0–MA2 represent a burst length, for example. Signals MA0–MA2 are decoded into signals BL1, BL2, BL4 and BL8 by means of decoder 200. Signal BL2 represents burst length 2, for example.

The semiconductor memory device shown in FIG. 8 further includes a data transfer circuit 235 provided for decoder 200. Data transfer circuit 235 is disposed between decoder 200 and data input/output lines BDQ0–BDQ3.

Data transfer circuit 235 includes inverter circuits 230 and 231#1231#4, and clocked inverter circuits 232#1–232#4. Inverter circuit 230 inverts control signal /MRSOUT output from command decoder 20, and outputs control signal MRSOUT. Inverter circuits 231#1–231#4 invert output signals BL1, BL2, BL4 and BL8 from decoder 200, respectively.

Clocked inverter circuits 232#1–232#4 invert respective outputs of inverter circuits 231#1–231#4 in response to control signals /MRSOUT and MRSOUT, and output the inverted signals onto respective data input/output lines BDQ0–BDQ3.

An operation of the semiconductor memory device according to the second embodiment of the present invention will now be described. As in the first embodiment, a mode register set command is input (signal /MSET is activated), and a certain value is thus set at mode register 2. Signals MA0, . . . are output from mode register 2, and decoded at decoder 200. Further, when a mode resister write command is issued to write the contents of mode resister 2 into a memory cell, one shot control signal /MRSOUT is generated (or activated).

In response to thus activated control signal /MRSOUT, decoded signals BL1, BL2, BL4, and BL8 output from decoder 200 are transferred to corresponding data input/output lines BDQ0–BDQ3, respectively. The data on data input/output lines BDQ0–BDQ3 are transmitted into data input/output buffer 12. Accordingly, decoded signals corresponding to the set value of mode register 2 are written into a specific memory cell.

The data in the specific memory cell is then read out in response to a normal read command, and the contents of mode register 2 are output at data input/output pins DQ0–DQ3. It thus becomes possible to monitor the mode set at mode register 2 by checking which data input/output pin DQ0–DQ3 is at an H level.

With such a configuration, the semiconductor memory device according to the second embodiment allows confirmation of the set value for a burst length, e.g., using a smaller number of pins than in semiconductor memory device 1000 of the first embodiment.

Third Embodiment

A semiconductor memory device according to the third embodiment of the present invention will be described. While a memory cell (or an address) for writing the set value of mode register 2 is fixed for the semiconductor memory device 1000 according to the first embodiment, the semiconductor memory device according to the third embodiment enables external designation of a memory cell for writing the set value of mode register 2 therein.

A configuration of the main portion of a semiconductor memory device according to the third embodiment will now be described with reference to FIGS. 9A, 9B, 10A and 10B.

FIGS. 9A and 9B are schematic block diagrams respectively showing exemplary configurations of an addressing command decoder 300 and an MRS output circuit 320 in the semiconductor memory device according to the third embodiment. In the third embodiment, a command decoder 300 is used along with command decoder 20, and MRS output circuit 320 is used instead of MRS output circuit 22.

Command decoder 300 includes NAND circuits 301, 306 and 309, NOR circuits 303 and 304, inverter circuits 302, 307#0, 307#1, 307#2, 305#0, 305#1 and 305#2, and inverter circuits 310 and 311.

NAND circuit 301 receives an internal row address strobe signal INTRAS, an internal column address strobe signal ZINTCAS, and an internal write enable signal INTWE as its inputs.

NOR circuit 303 receives an output of NAND circuit 301 and an internal address signal INTA8. Inverter circuit 302 inverts internal address signal INTA8. NOR circuit 304 receives the output of NAND circuit 301 and an output of inverter circuit 302.

Inverter circuits 305#0, 305#1 and 305#2 are serially connected between an output node of NOR circuit 303 and an input node of NAND circuit 306. NAND circuit 306 receives, as its inputs, an output of NOR circuit 303 and an output of inverter circuit 305#2, and outputs one shot row address set signal /MRASET.

Inverter circuits 307#0, 307#1 and 307#2 are serially connected between an output node of NOR circuit 304 and an input node of NAND circuit 309. NAND circuit 309 receives an output of NOR circuit 304 and an output of inverter circuit 307#2, and outputs one shot column address set signal /MCASET.

Inverter circuit 310 inverts row address set signal /MRASET and outputs a signal MRASET. Inverter circuit 311 inverts column address set signal/MCASET and outputs a signal MCASET.

MRS output circuit 320 shown in FIG. 9B includes NAND circuits 110, 111 and 112, inverter circuits 113, 114 and 115, delay circuits 116 and 117, and inverter circuits 332 and 334. Except for the inverter circuits 332 and 334, the configuration of MRS output circuit 320 is same as described for MRS output circuit 22 shown in FIG. 4.

Inverter circuit 332 inverts control signal /MRSOUT and outputs control signal MRSOUT. Inverter circuit 334 inverts a signal /MCAO, which is an output of NAND circuit 111, and outputs a signal MCAO.

Figure 10A:
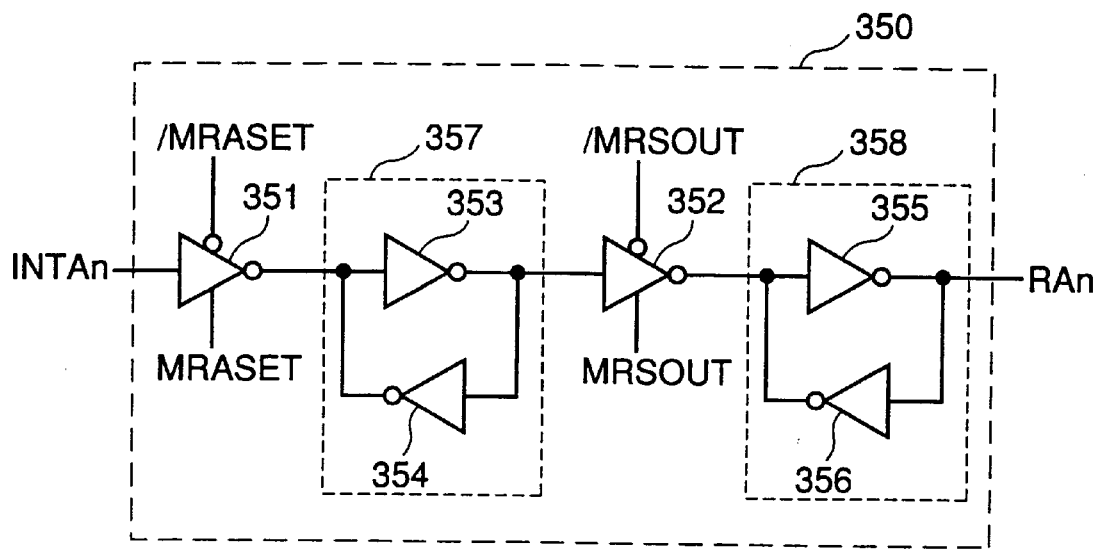
FIGS. 10A and 10B are schematic block diagrams showing exemplary configurations of an addressing circuit in the semiconductor memory device according to the third embodiment of the present invention.
Figure 10B:
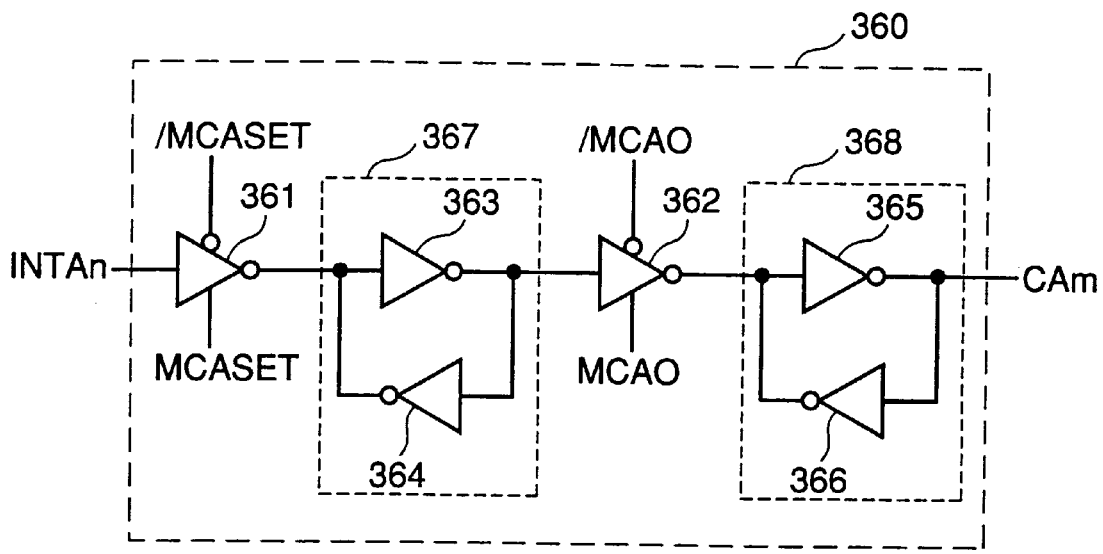

FIGS. 10A and 10B are schematic block diagrams respectively showing exemplary configurations of an addressing circuit in a semiconductor memory device according to the third embodiment of the present invention.

Addressing circuit 350 shown in FIG. 10A generates a row address signal. Addressing circuit 350 includes clocked inverter circuits 351 and 352, and inverter circuits 353, 354, 355 and 356.

Clocked inverter circuit 351 inverts internal address signal INTAn in response to row address set signals /MRASET and MRASET, and outputs the inverted signals. Inverter circuits 353 and 354 constitute a latch circuit 357. Latch circuit 357 is connected between clocked inverter circuits 351 and 352.

Clocked inverter circuit 352 inverts an output of latch circuit 357 in response to control signals /MRSOUT and MRSOUT, and outputs the inverted signal. Inverter circuits 355 and 356 constitute a latch circuit 358. Latch circuit 358 receives an output of clocked inverter circuit 352 and outputs a row address signal RAn.

Addressing circuit 360 shown in FIG. 10B generates a column address signal. Addressing circuit 360 includes clocked inverter circuits 361 and 362, and inverter circuits 363, 364, 365 and 366.

Clocked inverter circuit 361 inverts internal address signal INTAn in response to column address set signals /MCASET and MCASET, and outputs the inverted signal. Inverter circuits 363 and 364 constitute a latch circuit 367. Latch circuit 367 is connected between clocked inverter circuits 361 and 362.

Clocked inverter circuit 362 inverts an output of latch circuit 367 in response to signals /MCAO and MCAO, and outputs the inverted signal. Inverter circuits 365 and 366 constitute a latch circuit 368, which receives an output of clocked inverter circuit 362 and outputs column address signal CAm.

Next, an operation of the semiconductor memory device according to the third embodiment will be described. If an external address signal A8 is at an L level at the time when a mode register set command is input, for example, one shot row address set signal /MRASET is generated. Clocked inverter circuit 351 is activated in response, and internal address signal INTAn (n=0–12) is latched into latch circuit 357.

Likewise, if external address signal A8 is at an H level at the time when the mode register set command is input, one shot column address set signal /MCASET is generated, and in response, clocked inverter circuit 361 is activated and internal address signal INTAn (n=0–8) is latched into latch circuit 367.

Thereafter, as in the first and second embodiments, a mode resister write command to write the contents of mode register 2 into a memory cell is input, whereby control signal /MRSOUT is activated to an L level. Accordingly, signals /MCAO and MCAO are activated.

In response to thus activated control signals /MRSOUT and MRSOUT, clocked inverter circuit 352 is activated, and a signal from latch circuit 357 is latched into latch circuit 358. Latch circuit 358 outputs row address signal RAn (n=0–12).

In response to the activated signals /MCAO and MCAO, clocked inverter circuit 362 is activated, and a signal from latch circuit 367 is latched into latch circuit 368. Latch circuit 368 outputs column address signal CAm (m=0–8).

With such a configuration, it becomes possible to choose a desired address for writing the set value of mode register 2 therein. As a result, the set value of mode register 2 can be written into an address that is not in use in a normal operation.

Fourth Embodiment

A semiconductor memory device according to the fourth embodiment of the present invention will now be described. The semiconductor memory device according to the fourth embodiment compares an originally intended value (i.e., a target value) and an actually set value for a respective mode to determine match/mismatch therebetween, and writes the result of the comparison and determination into a memory cell.

Figure 11:
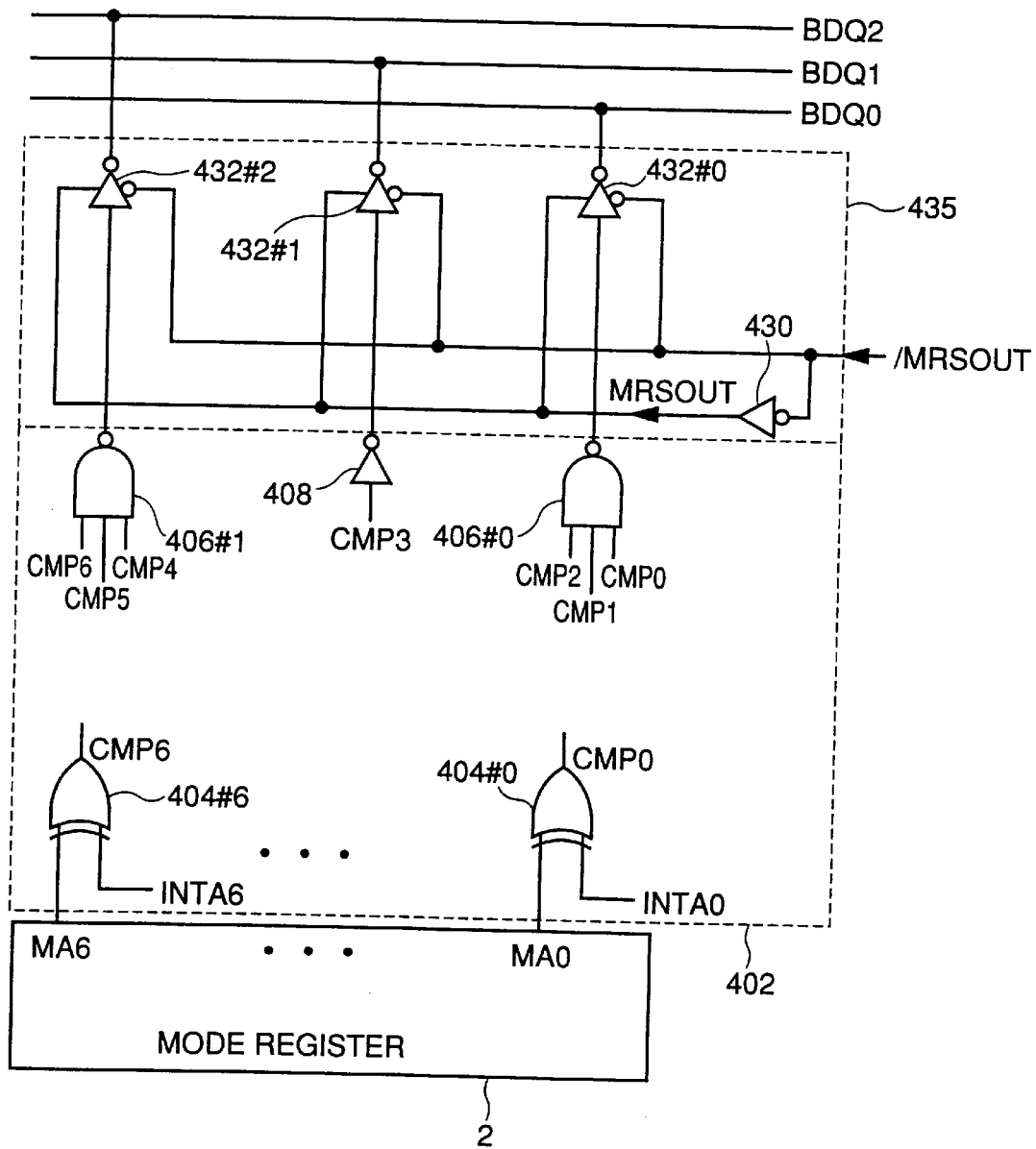
FIGS. 11 and 12 are schematic block diagrams respectively showing exemplary configurations of the main portions of semiconductor memory devices according to fourth and fifth embodiments of the present invention.

A configuration of the main portion of a semiconductor memory device according to the fourth embodiment will now be described with reference to FIG. 11. In FIG. 11, same components as in the semiconductor memory device 1000 shown in FIG. 1 are denoted by same characters and symbols, and therefore, description thereof is not repeated.

The semiconductor memory device shown in FIG. 11 includes a comparison and determination circuit 402. Comparison and determination circuit 402 includes EXOR circuits 404#0–404#6, NAND circuits 406#0and 406#1, and an inverter circuit 408.

EXOR circuits 404#0–404#6are disposed corresponding to respective output signals MA0–MA6 of mode register 2. For example, signals MA0–MA represent a burst length, signal MA3 represents a burst type, and signals MA4–MA6 represent a CAS latency.

EXOR circuits 404#0–404#6receive respective internal address signals INTA0–INTA6 and an output signal of mode register 2, respectively.

Each of EXOR circuits 404#0–404#6outputs a signal at an L level when the input signals match with each other, or otherwise outputs a signal at an H level. Signals CMP0, . . . , CMP6 are output from respective EXOR circuits 404#0, . . . , 404#6.

Signal CMP0 is an output of EXOR circuit 404#0receiving signals MA0 and INTA0. Signal CMP1 is an output of an EXOR circuit (not shown) receiving signals MA1 and INTA1. Signal CMP2 is an output of an EXOR circuit (not shown) receiving signals MA2 and INTA2. Signal CMP3 is an output of an EXOR circuit (not shown) receiving signals MA3 and INTA3. Signal CMP4 is an output of an EXOR circuit (not shown) receiving signals MA4 and INTA4. Signal CMP5 is an output of an EXOR circuit (not shown) receiving signals MA5 and INTA5. And signal CMP6 is an output of EXOR circuit 404#6receiving signals MA6 and INTA6.

NAND circuit 406#0receives signals CMP0, CMP1 and CMP2. NAND circuit 406#1receives signals CMP4, CMP5 and CMP6. Inverter circuit 408 receives signal CMP3.

When an address signal corresponding to a burst length is input, internal address signals INTA0–INTA2 derived from the address signal are compared with mode resister output signals MA0–MA2 representing the burst length, and the result of the comparison and determination is output from NAND circuit 406#0.

In the configuration shown in FIG. 11, a data transfer circuit 435 provided for comparison and determination circuit 402 is disposed between comparison and determination circuit 402 and data input/output lines BDQ0–BDQ2.

Data transfer circuit 435 includes an inverter circuit 430 and clocked inverter circuits 432#0–432#2. Inverter circuit 430 inverts control signal /MRSOUT output from command decoder 20 and outputs control signal MRSOUT.

Clocked inverter circuit 432#0inverts an output of NAND circuit 406#0in response to control signals /MRSOUT and MRSOUT, and outputs the inverted signal. Clocked inverter circuit 432#1inverts an output of inverter circuit 408 in response to control signals /MRSOUT and MRSOUT, and outputs the inverted signal. Clocked inverter circuit 432#2inverts an output of NAND circuit 406#1in response to control signals /MRSOUT and MRSOUT and outputs the inverted signal.

Data input/output lines BDQ0, BDQ1 and BDQ2 receive outputs of clocked inverter circuits 432#0, 432#1and 432#2, respectively. Each data input/output line receives a signal at an H level when the set value of mode register 2 matches with the input address, and receives a signal at an L level when they mismatch.

The result of the comparison and determination corresponding to a burst length (output from NAND circuit 406#0), for example, is written into a memory cell via data input/output line BDQ0. The write address may be a fixed address or a variable address as described above.

With such a configuration, it becomes possible to externally monitor the set contents (the results of the comparison and determination) regarding burst length, burst type and CAS latency, by a normal read operation.

Fifth Embodiment

A semiconductor memory device according to the fifth embodiment of the present invention will be described. Although match/mismatch was determined for each mode in the fourth embodiment, the semiconductor memory device according to the fifth embodiment determines perfect match/mismatch for every mode and writes the result into a memory cell.

Figure 12:
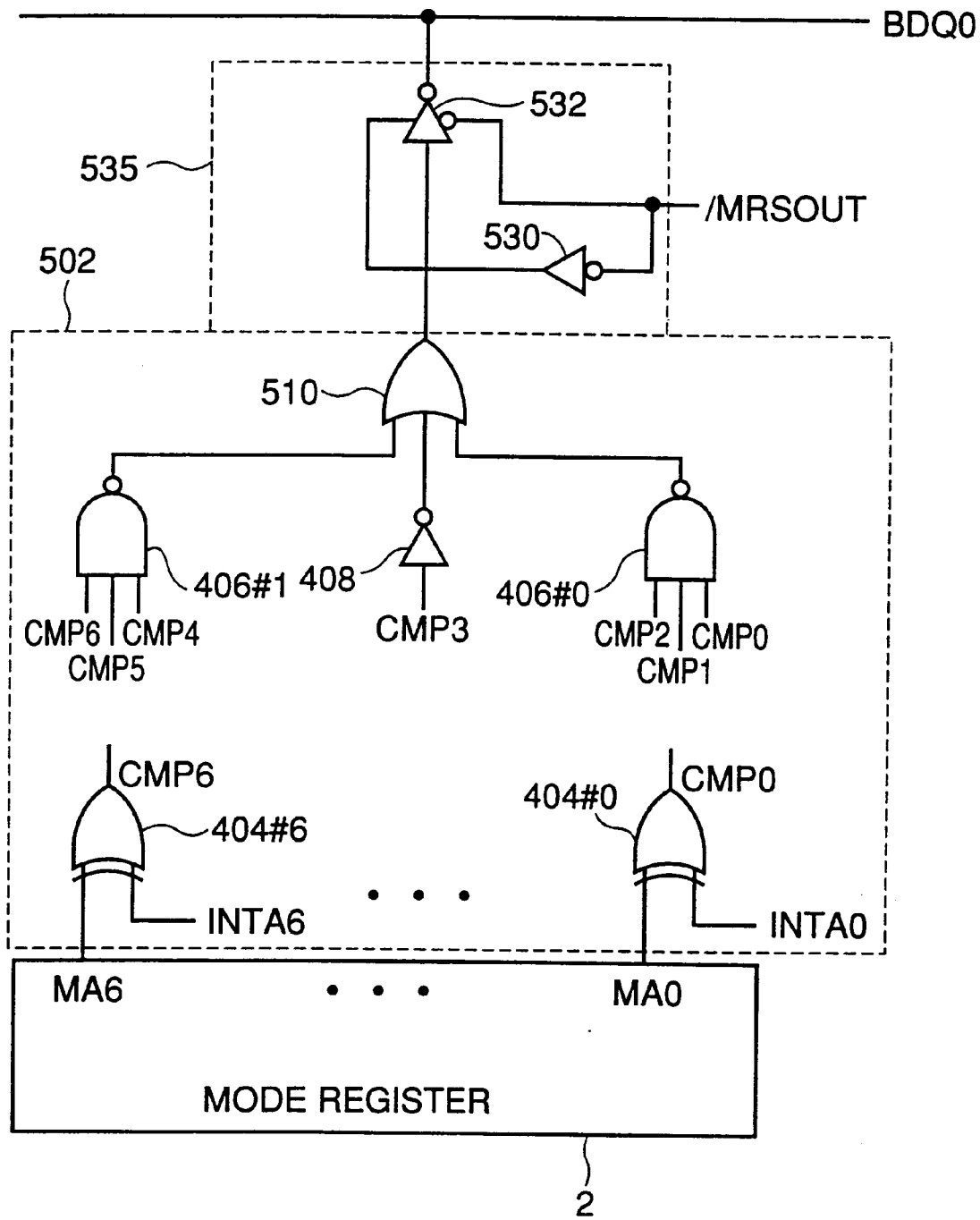

A configuration of the main portion of a semiconductor memory device according to the fifth embodiment will be described with reference to FIG. 12. In FIG. 12, same components as in the semiconductor memory device shown in FIG. 11 are denoted by same characters and symbols, and therefore, description thereof is not repeated.

The semiconductor memory device shown in FIG. 12 includes a comparison and determination circuit 502. Comparison and determination circuit 502 includes EXOR circuits 404#0–404#6, NAND circuits 406#0and 406#1, an inverter circuit 408 and an NOR circuit 510. Comparison and determination circuit 502 differs from comparison and determination circuit 402 in that the former includes the NOR circuit 510.

NOR circuit 510 receives respective outputs from NAND circuits 406#0and 406#1and from inverter circuit 408. Accordingly, the result of the comparison and determination for every mode is put together into a single signal.

In the configuration shown in FIG. 12, a data transfer circuit 535 provided for the comparison and determination circuit 502 is disposed between comparison and determination circuit 502 and data input/output line BDQ0.

Data transfer circuit 535 includes an inverter circuit 530 and a clocked inverter circuit 532. Inverter circuit 530 inverts control signal /MRSOUT output from command decoder 20 and outputs control signal MRSOUT.

Clocked inverter circuit 532 inverts an output signal of NOR circuit 510 in response to control signals /MRSOUT and MRSOUT, and outputs the inverted signal. Data input/output line BDQ0 receives the output of clocked inverter circuit 532.

Specifically, address signals corresponding to originally intended values (target values) for mode register 2 are input. If the address signals match with the actually set values for all the modes, a signal at an H level is transferred onto data input/output line BDQ0; otherwise, a signal at an L level is transferred thereto. As a result, a signal showing perfect match/mismatch is written into a memory cell.

A read command is used to read out whether desired values have been set at mode register 2 or not. In this case, the result can be monitored by checking a single data input/output pin DQ0.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a memory cell array including a plurality of memory cells arranged in rows and columns;
   a mode register responsive to a mode register set signal externally input for setting a value designating a specific operation mode;
   control means responsive to a specific operation signal externally input for outputting a control signal to externally monitor the set value of said mode register;
   write means responsive to a write instruction for writing the set value of said mode register into a specific memory cell among said plurality of memory cells according to said control signal; and
   read means responsive to a read instruction for reading data of said memory cell array.

2. The semiconductor memory device according to claim 1, further comprising:
   a data input/output pin;
   a data input/output buffer for exchanging data between said data input/output pin and said memory cell array; and
   a data input/output line for exchanging data with said data input/output buffer;
   wherein said write means includes
      transfer means responsive to said control signal for transferring the set value of said mode register onto said data input/output line, and
      write control means responsive to said write instruction for writing data received by said data input/output buffer into said specific memory cell.

3. The semiconductor memory device according to claim 2, wherein an address corresponding to said specific memory cell is fixed.

4. The semiconductor memory device according to claim 2, wherein said write control means includes
   addressing means responsive to said control signal for designating an address corresponding to said specific memory cell according to an external address signal.

5. The semiconductor memory device according to claim 1, further comprising:
   a data input/output pin;
   a data input/output buffer for exchanging data between said data input/output pin and said memory cell array; and
   a data input/output line for exchanging data with said data input/output buffer;
   wherein said write means includes
      decode means for decoding the set value of said mode register,
      transfer means responsive to said control signal for transferring an output of said decode means onto said data input/output line, and
      write control means responsive to said write instruction for writing the data received by said data input/output buffer into said specific memory cell.

6. The semiconductor memory device according to claim 5, wherein an address corresponding to said specific memory cell is fixed.

7. The semiconductor memory device according to claim 5, wherein said write control means includes
   addressing means responsive to said control signal for designating an address corresponding to said specific memory cell according to an external address signal.

8. The semiconductor memory device according to claim 1, further comprising:
   a data input/output pin;
   a data input/output buffer for exchanging data between said data input/output pin and said memory cell array; and
   a data input/output line for exchanging data with said data input/output buffer;
   wherein said write means includes
      comparison and determination means for comparing the set value of said mode register and an external address signal and for determining match/mismatch therebetween,
      transfer means responsive to said control signal for transferring an output of said comparison and determination means onto said data input/output line, and
      write control means responsive to said write instruction for writing the data received by said data input/output buffer into said specific memory cell.

9. The semiconductor memory device according to claim 8, wherein an address corresponding to said specific memory cell is fixed.

10. The semiconductor memory device according to claim 8, wherein said write control means includes
    addressing means responsive to said control signal for designating an address corresponding to said specific memory cell according to the external address signal.

11. The semiconductor memory device according to claim 1, further comprising:
    a data input/output pin;
    a data input/output buffer for exchanging data between said data input/output pin and said memory cell array; and
    a data input/output line for exchanging data with said data input/output buffer;
    wherein said specific operation mode includes a plurality of specific operation modes;
    said mode register outputs a plurality of set values each corresponding to a respective one of said plurality of specific operation modes; and
    said write means includes
       a plurality of comparison and determination means each provided corresponding to a respective one of said plurality of set values for comparing the respective one of said plurality of set values with a respective one of external address signals to determine a respective match/mismatch,
       transfer means responsive to said control signal for transferring a respective one of outputs of said plurality of comparison and determination means onto said data input/output line, and
       write control means responsive to said write instruction for writing the data received by said data input/output buffer into said specific memory cell.

12. The semiconductor memory device according to claim 11, wherein an address corresponding to said specific memory cell is fixed.

13. The semiconductor memory device according to claim 11, wherein said write control means includes
    addressing means responsive to said control signal for designating an address corresponding to said specific memory cell according to an external address signal.

14. The semiconductor memory device according to claim 1, further comprising:

a data input/output pin;

a data input/output buffer for exchanging data between said data input/output pin and said memory cell array; and a data input/output line for exchanging data with said data input/output buffer;

wherein said specific operation mode includes a plurality of specific operation mode;

said mode register outputs a plurality of set values each corresponding to a respective one of said plurality of specific operation modes; and said write means includes comparison and determination means for comparing respective ones of said plurality of set values with respective ones of external address signals, collecting the respective results on match/mismatch therebetween, and for determining a perfect match/mismatch, transfer means responsive to said control signal for transferring an output of said comparison and determination means onto said data input/output line, and write control means responsive to said write instruction for writing the data received by said data input/output buffer into said specific memory cell.

15. The semiconductor memory device according to claim 14, wherein an address corresponding to said specific memory cell is fixed.

16. The semiconductor memory device according to claim 14, wherein said write control means includes addressing means responsive to said control signal for designating an address corresponding to said specific memory cell according to an external address signal.

* * * * *